(12) United States Patent
Hayamizu

(10) Patent No.: US 8,400,046 B2
(45) Date of Patent: Mar. 19, 2013

(54) POWER GENERATION UNIT

(76) Inventor: Kohei Hayamizu, Mitaka (JP)

( * ) Notice: Subject to any disclaimer, the term of this patent is extended or adjusted under 35 U.S.C. 154(b) by 216 days.

(21) Appl. No.: 12/741,907

(22) PCT Filed: Nov. 11, 2008

(86) PCT No.: PCT/JP2008/003252
§ 371 (c)(1), (2), (4) Date: Aug. 13, 2010

(87) PCT Pub. No.: WO2009/063610
PCT Pub. Date: May 22, 2009

(65) Prior Publication Data
US 2010/0308691 A1    Dec. 9, 2010

(30) Foreign Application Priority Data
Nov. 13, 2007  (JP) ................. 2007-294922

(51) Int. Cl.
H01L 41/113 (2006.01)
(52) U.S. Cl. ........................ 310/339; 310/332
(58) Field of Classification Search .......... 310/330–332, 310/339
See application file for complete search history.

(56) References Cited

U.S. PATENT DOCUMENTS

| | | | | |
|---|---|---|---|---|
| 3,967,141 A | * | 6/1976 | Gawlick et al. | 310/339 |
| 4,952,836 A | * | 8/1990 | Robertson | 310/339 |
| 5,804,906 A | * | 9/1998 | Tsutsumi | 310/322 |
| 5,814,921 A | * | 9/1998 | Carroll | 310/339 |
| 7,078,850 B2 | * | 7/2006 | Sakai | 310/339 |
| 7,247,976 B2 | * | 7/2007 | Sashida et al. | 310/330 |
| 2006/0119224 A1 | * | 6/2006 | Keolian et al. | 310/339 |
| 2008/0074002 A1 | * | 3/2008 | Priya et al. | 310/339 |

FOREIGN PATENT DOCUMENTS

| | | |
|---|---|---|
| JP | 07-49388 A | 2/1995 |
| JP | 11-303726 A | 11/1999 |
| JP | 2005-144594 A | 6/2005 |
| JP | 2006-166694 A | 6/2006 |
| JP | 2007-097278 | * 4/2007 |
| JP | 2007-097278 A | 4/2007 |

OTHER PUBLICATIONS

Chinese Office Action corresponding to Chinese Patent Application No. 200880115956.9, dated Nov. 17, 2012.
Chinese Search report corresponding to Chinese Patent Application No. 200880115956.9, received Oct. 18, 2012.
Chinese Office Action corresponding to Chinese Patent Application No. 200880115956.9, dated Sep. 24, 2012.

* cited by examiner

*Primary Examiner* — Thomas Dougherty
(74) *Attorney, Agent, or Firm* — Sughrue Mion, PLLC (57) ABSTRACT

A power generation unit (1A) for converting an externally applied force into electricity comprises piezoelectric elements (22, 23), and a central spacer (24) and a peripheral spacer (25) provided, respectively, between a plurality of stacked piezoelectric elements (22, 23) or provided, respectively, between a plane for pressing the piezoelectric elements (22, 23) and the piezoelectric elements (22, 23) in order to form the deformation space of the piezoelectric elements (22, 23) and to transmit a deformation force to the piezoelectric elements. For example, the piezoelectric elements (22, 23) are fixed, respectively, to the both sides of a flexible diaphragm (21), columnar central spacers (24) are arranged on the piezoelectric elements (22, 23) and an annular peripheral spacer (25) is arranged on the diaphragm (21).

7 Claims, 10 Drawing Sheets

POWER GENERATION UNIT

CROSS REFERENCE TO RELATED APPLICATION

This application is a National Stage of International Application No. PCT/JP2008/003252 filed Nov. 11, 2008, claiming priority based on Japanese Patent Application No. 2007-294922, filed Nov. 13, 2007, the contents of all of which are incorporated herein by reference in their entirety.

TECHNICAL FIELD

The present invention relates to a power generation unit that can convert an externally applied force into electricity and take out the electricity.

BACKGROUND ART

As a conventional power generating structure using a piezoelectric element, for example, there are known a structure that applies an external force directly to a piezoelectric element, thereby deforming the piezoelectric element to obtain an electromotive force (see, for example, Patent Document 1), and a structure that applies a force such as a wind force indirectly to a piezoelectric element, thereby deforming the piezoelectric element to obtain an electromotive force (see, for example, Patent Document 2).

Patent Document 1: Japanese Patent Application Laid-open No. H7-49388
Patent Document 2: Japanese Patent Application Laid-open No. H11-303726

DISCLOSURE OF INVENTION

Problem to be Solved by the Invention

However, power generation capacity obtained by one piezoelectric element is small. Therefore, to obtain necessary power, it is necessary to use a large number of piezoelectric elements. In this case, when the large number of piezoelectric elements are merely arranged on the same plane, it is necessary to disperse an external force to the respective piezoelectric elements, and therefore it is difficult to effectively apply the external force to the respective piezoelectric elements.

On the other hand, when a large number of piezoelectric elements are merely stacked, the outermost piezoelectric element can be deformed to some extent; however, deformations of other inner piezoelectric elements are hindered by other piezoelectric elements, and there is a possibility that the power generating efficiency is deteriorated. Thus, when a large number of piezoelectric elements are stacked in this manner, to freely deform each of the piezoelectric elements, there is an idea of providing supporting units for individually supporting the piezoelectric elements. However, this idea is undesirable because the structure of the supporting unit becomes complicated as the number of piezoelectric elements is increased, the weight of the supporting unit is increased and the manufacturing cost for the supporting unit is increased.

The present invention has been achieved in view of the above problems, and an object of the present invention is to provide a power generation unit that can effectively transmit an external force to piezoelectric elements without dispersing the external force to enhance the power generating efficiency, and can support a large number of piezoelectric elements in a simplified manner.

Means for Solving Problems

To solve the above problems, one aspect of the present invention provides a power generation unit that converts an externally applied force into electricity, comprising: a plurality of piezoelectric elements; and spacers that are arranged between the piezoelectric elements, which are arranged in a stacked manner, or arranged between the piezoelectric element and a pressing surface that presses the piezoelectric element, wherein the spacer forms a deformation space of the piezoelectric element and transmits a deformation force to the piezoelectric element.

BRIEF DESCRIPTION OF THE DRAWINGS

FIGS. 9($a$) to ($p$) show vertical cross section shapes of a vibration board 21 according to modifications in a simplified manner.

EXPLANATIONS OF REFERENCE NUMERALS 1A, 1C, 10, 1E, 1F, 1G, 1H power generation unit
2A, 2B, 2C, 2D, 2E, 2F, 2H power generation module
3A, 3C, 3D, 3E module supporting body
4 pair module
21, 27 vibration board
22, 23 piezoelectric element
24 central spacer
25 peripheral spacer
28, 29 floorboard
31 case body
32 pressurizing block
33 pedal shaft
34, 36, 37 LED
35 push button
36 cord

BEST MODE(S) FOR CARRYING OUT THE INVENTION

Embodiments of a power generation unit according to the present invention will be explained below in detail with reference to the accompanying drawings. First, [I] the basic concept common to respective embodiments is explained, [II] specific contents of the respective embodiments are then explained, and finally [III] modifications of the respective embodiments are explained. Note that the present invention is not limited to the embodiments.

[I] Basic Concept Common to Respective Embodiments

The basic concept common to respective embodiments is described first. An object of a power generation unit according to each embodiment is to convert an external force into electricity and take it out.

A specific usage mode of the power generation unit according to the embodiment is not arbitrary, and for example, when the power generation unit is embedded in an entire floor of a ticket gate of a station or a doorway of a department store, all of passengers step on the power generation unit, and a relatively high power generation capacity can be obtained. In this case, the power generation unit can be incorporated in a circuit together with a storage battery or a capacitor, and a current can be smoothened or the current can be stored or discharged. Other specific usage modes are described in a form of embodiments.

[II] Specific Contents of Respective Embodiments

Specific contents of the respective embodiments of the present invention are explained below with reference to the accompanying drawings.

First Embodiment

A first embodiment is explained first. The present embodiment is a mode in which a stacked structure of piezoelectric elements is devised to enhance the power generating efficiency and the like.

Figure 1:
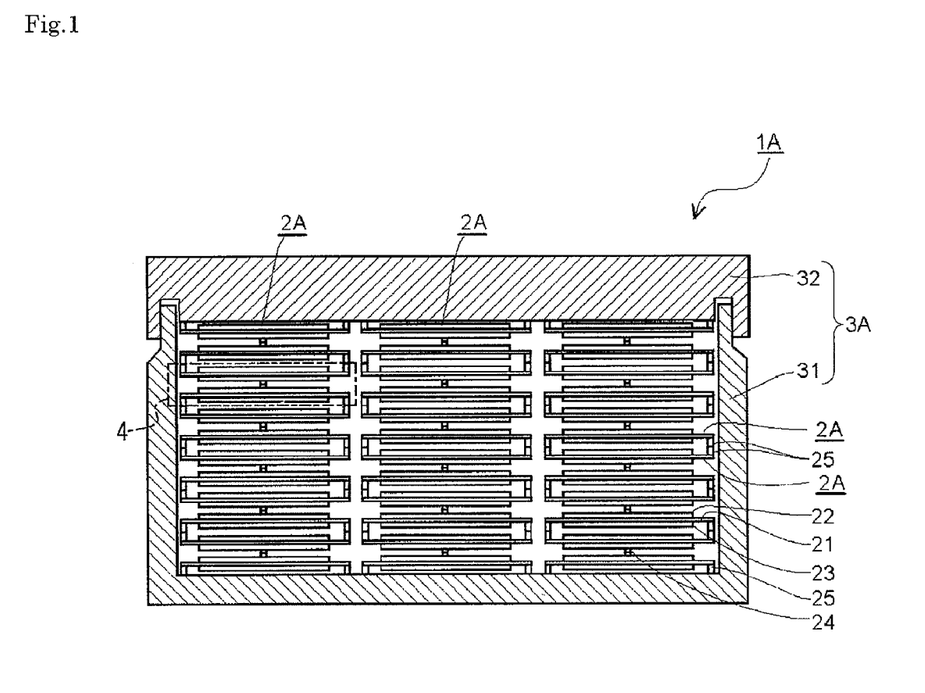
FIG. 1 A vertical sectional view of an entire power generation unit according to a first embodiment.
Figure 2:
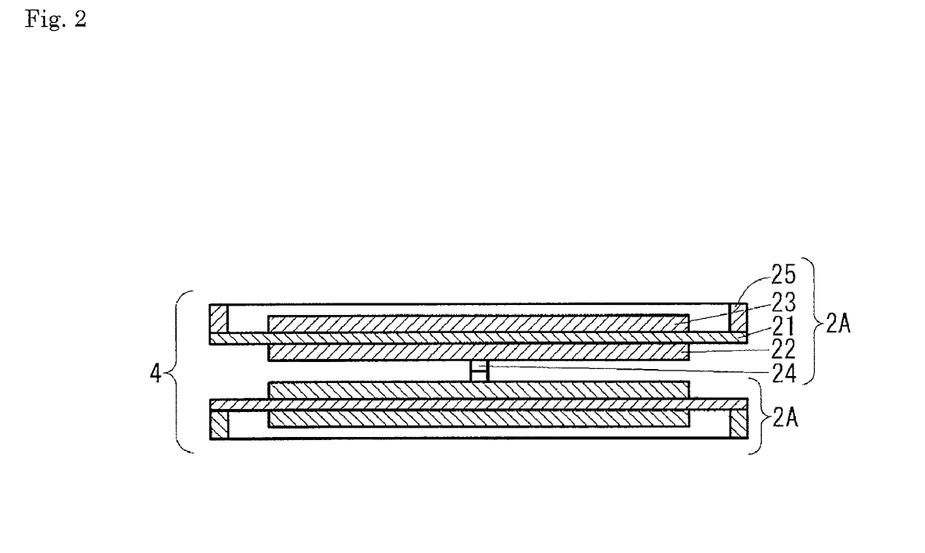
FIG. 2 A vertical sectional view of a pair module in FIG. 1.
Figure 3:
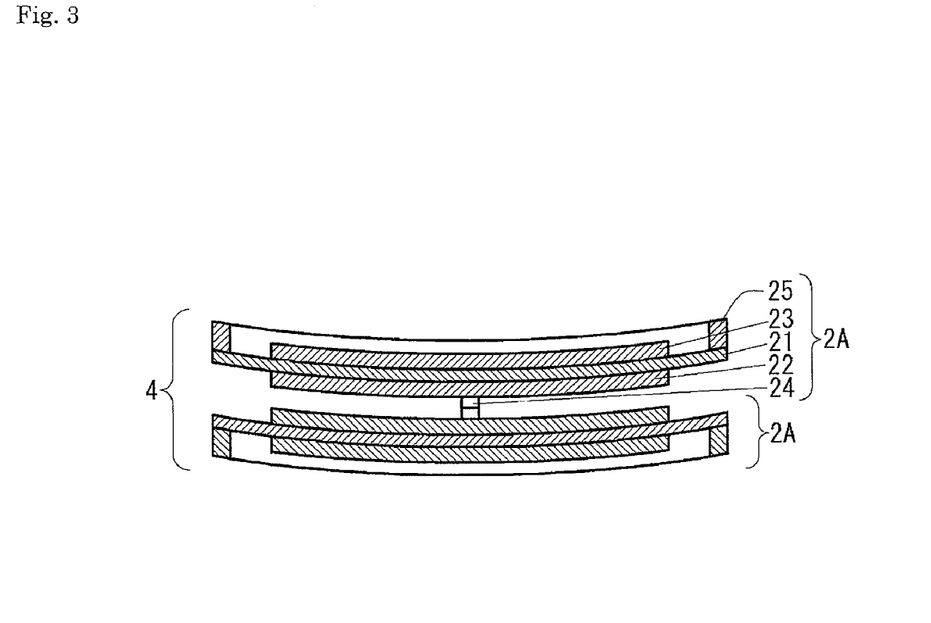
FIG. 3 A vertical sectional view showing a pair module in a deformed state.
Figure 4:
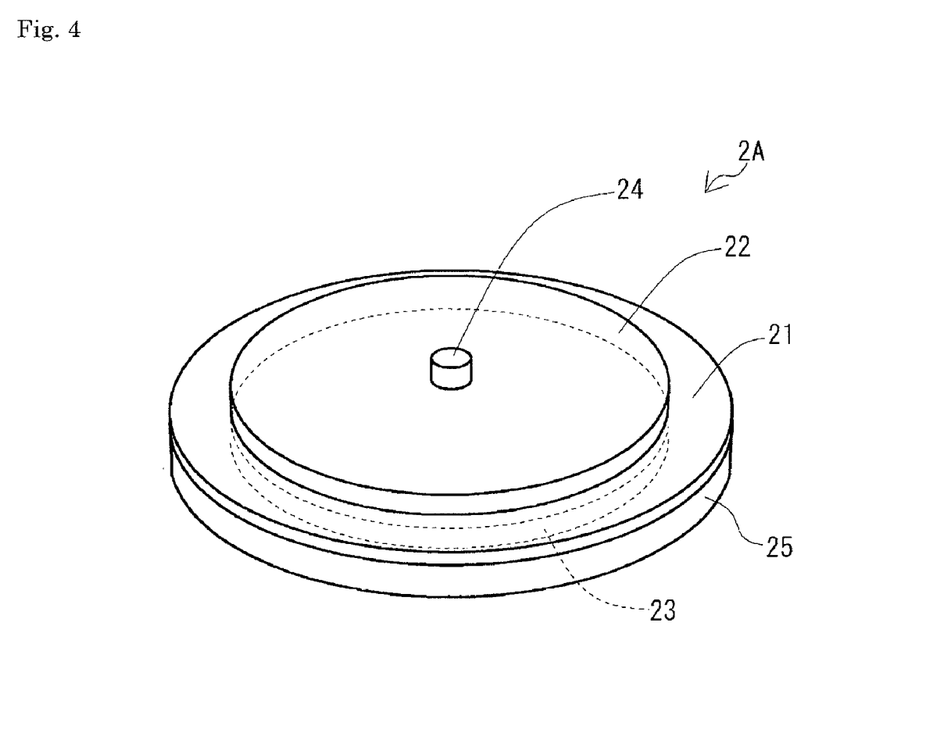
FIG. 4 A perspective view of a power generation module as viewed from above.
Figure 5:
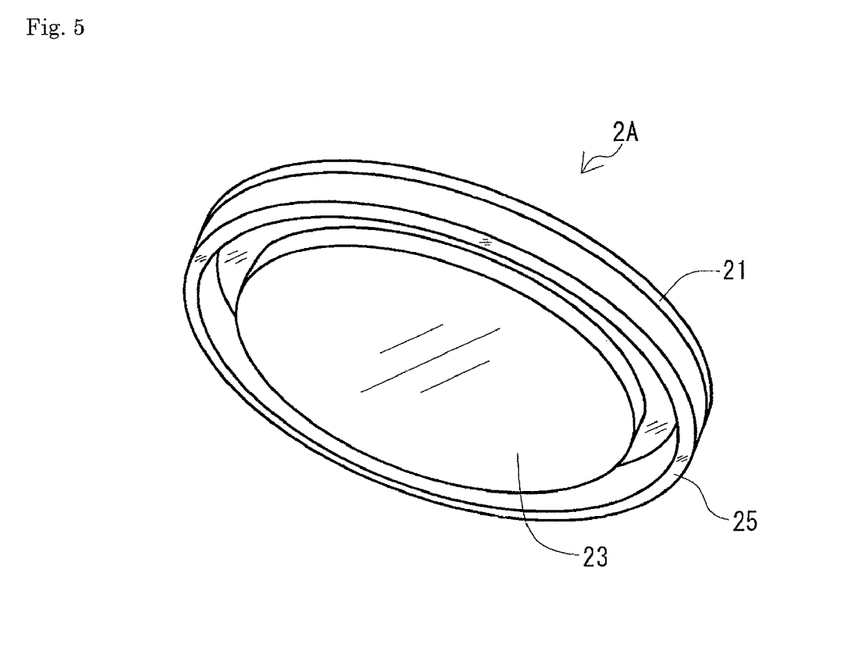
FIG. 5 A perspective view of a power generation module as viewed from below.

FIG. 1 is a vertical sectional view of the entire power generation unit according to the first embodiment, FIG. 2 is a vertical sectional view of a pair module in FIG. 1, FIG. 3 is a vertical sectional view showing a pair module in a deformed state, FIG. 4 is a perspective view of a power generation module as viewed from above, FIG. 5 is a perspective view of the power generation module as viewed from below. As shown in FIG. 1, a power generation unit 1A includes a plurality of stacked power generation modules 2A and a module supporting body 3A that accommodates the power generation modules 2A.

(Configuration—Power Generation Module 2A)

Each of the power generation modules 2A includes a vibration board 21, a pair of piezoelectric elements 22 and 23, a central spacer 24, and a peripheral spacer 25.

The vibration board 21 is a supporting body that applies a stress to the piezoelectric elements 22 and 23, and also functions as a reinforcing member that reinforces a cracking strength of the piezoelectric elements. The vibration board 21 is made of metal plate having flexibility and durability. A specific material used for the vibration board 21 is arbitrary, and a stainless steel thin plate can be used. While the flat surface shape of the vibration board 21 is arbitrary, it is preferable that the vibration board 21 equally deforms with respect to an external force, and in the first embodiment, the flat surface shape of the vibration board 21 is circular.

The pair of piezoelectric elements 22 and 23 are deformed by a pressure, thereby generating electricity. The piezoelectric elements 22 and 23 are made of piezoelectric ceramic such as barium titanate and zirconia, or piezoelectric single crystal such as lithium tantalate (LiTaO3), for example. Any material that can generate power by an external force (including forces generating distortion, bending, or compression) can be used as the piezoelectric elements 22 and 23 or instead of the piezoelectric elements 22 and 23. For example, it is possible to use IPMC (Ionic Polymer-Metal Composite) in which both surfaces of an ionic conductive polymer film (gel) are plated with metal (such as gold), ICPF (Ionic Conducting Polymergel Film), or an artificial muscle using IPMC or ICPF. The piezoelectric elements 22 and 23 are formed into thin plate shapes that are slightly smaller than the vibration board 21, and are fixed on both surfaces of the vibration board 21 by an adhesive or the like. While the flat surface shapes of the piezoelectric elements 22 and 23 are arbitrary, they preferably are similar to the vibration board 21 in shape. In the first embodiment, the flat surface shapes of the piezoelectric elements 22 and 23 are circular shapes having a diameter smaller than that of the vibration board 21. A two-dimensional arrangement of each of the piezoelectric elements 22 and 23 with respect to the vibration board 21 is arbitrary; however, because a deformation amount of the piezoelectric element at a flat surface central position of the vibration board 21 becomes the greatest, and therefore it is preferable that the piezoelectric elements 22 and 23 are arranged at the flat surface central positions of the vibration board 21. In the first embodiment, the piezoelectric elements 22 and 23 are arranged concentrically with the vibration board 21. Although not illustrated in the drawings, each of the piezoelectric elements 22 and 23 is provided at its one of surfaces with a plus terminal, and at its other surface with a minus terminal, a plus lead wire connected to the plus terminal and a minus lead wire connected to the minus terminal are pulled out, they are connected to a load (not shown), and power is supplied to the load. Note that various electric elements such as a known bridge circuit can be arranged between the piezoelectric elements and the load.

The central spacer 24 is a transmitting member that transmits deformations of the piezoelectric elements 22 and 23 in the power generation module 2A to piezoelectric elements 22 and 23 of the other power generation module 2A that is adjacent to the former power generation module 2A, and also maintains constant a distance between the adjacent piezoelectric elements 22 and 23. The central spacer 24 is fixed to one of the pair of piezoelectric elements 22 and 23 (here, the piezoelectric element 22) fixed to the vibration board 21. The central spacer 24 is arranged near a central portion of the piezoelectric element 22, and is fixed to the piezoelectric elements 22 by an adhesive or the like.

The peripheral spacer 25 maintains constant a distance between the adjacent power generation modules 2A. The peripheral spacer 25 is fixed on the side of an outer periphery of one of the piezoelectric elements 22 and 23 or the vibration board 21 (here, the vibration board 21), and the peripheral spacer 25 is thicker than the piezoelectric element 23 so that the peripheral spacer 25 projects outward of the piezoelectric element 23. While a specific shape of the peripheral spacer 25 is arbitrary, the peripheral spacer 25 is formed to surround the piezoelectric element 23, and is formed as an annular body arranged concentrically with the vibration board 21.

Figure 6:
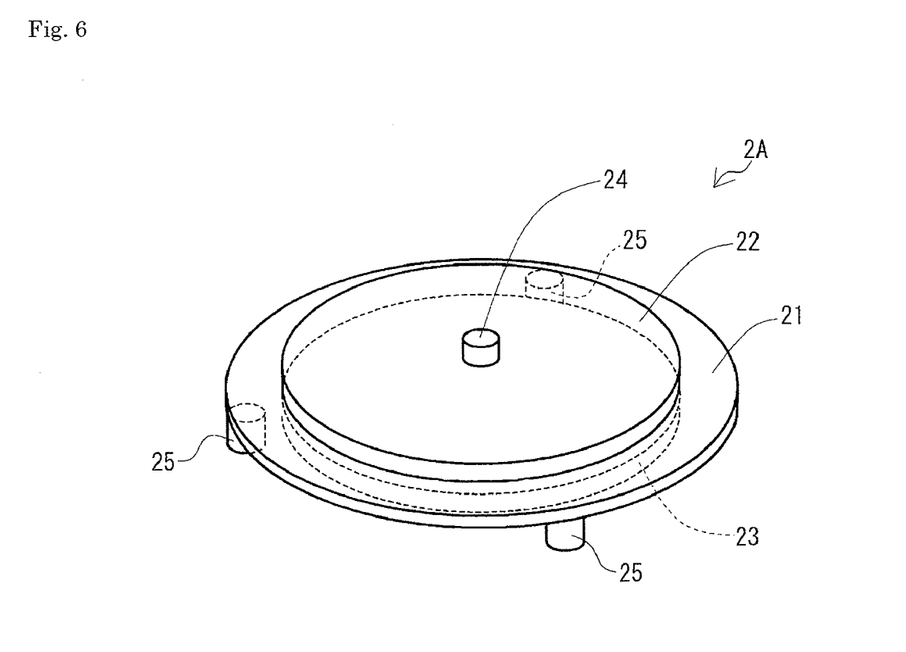
FIG. 6 A perspective view of a power generation module according to a modification as viewed from above.
Figure 7:
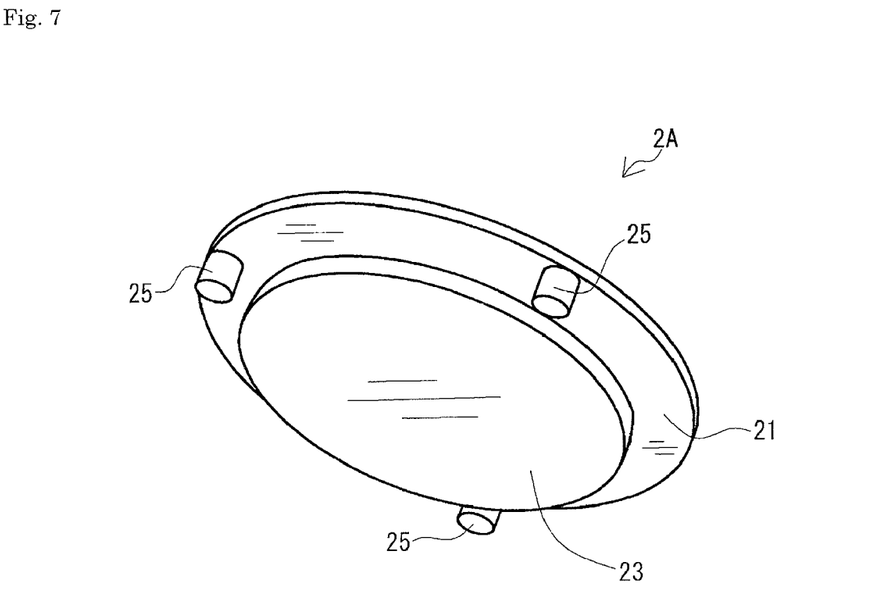
FIG. 7 A perspective view of a power generation module according to the modification as viewed from below.

Alternatively, the peripheral spacer 25 can be formed into another shape. FIG. 6 is a perspective view of a power generation module according to a modification as viewed from above, and FIG. 7 is a perspective view of a power generation module according to the modification as viewed from below. As shown in FIGS. 6 and 7, the peripheral spacers 25 can be formed as columnar bodies arranged along a circumferential direction surrounding the piezoelectric element 23. When the peripheral spacers 25 are formed into the columnar bodies, to stabilize the stacked structure, it is preferable that the peripheral spacers 25 are arranged at three locations or more corresponding to apexes of a regular triangle having a centroid at a flat surface center position of the vibration board 21.

(Structure—Stacked Structure of Power Generation Module 2A)

The stacked structure of the power generation module 2A with the above configuration is as follows. That is, as shown in the vertical sectional view in FIG. 2, the power generation modules 2A are stacked such that the central spacer 24 of one of the power generation modules 2A is in contact, on the same axis, with the central spacer 24 of the other power generation module 2A that is adjacent to the former power generation module 2A. The pair of power generation modules 2A that are stacked in this manner are called a pair module 4 as shown in FIG. 2. In each pair module 4, the piezoelectric elements 22 and 23 are connected to each other through the central spacer 24. Therefore, when the one piezoelectric element 22 deform, the other piezoelectric elements 23 are pressed through the central spacer 24 and are deformed. In other words, by applying the external force to the one piezoelectric element 22, substantially the same external force can be also applied to the other piezoelectric elements 23. Because a distance between the two piezoelectric elements 22 located on the inner side of the one pair module 4 is maintained constant through the central spacer 24, it is possible to prevent the two piezoelectric elements 22 from coming into contact with each other.

The power generation unit is constituted by stacking the pair modules 4 as shown in FIG. 1. More specifically, the pair modules 4 are stacked such that the peripheral spacer 25 of each pair module 4 is in contact with another peripheral spacer 25 that is adjacent to the pair module 4. According to this structure, the piezoelectric elements 22 and 23 of each pair module 4 deform, and the vibration board 21 to which these piezoelectric elements 22 and 23 are fixed also deforms. Therefore, the peripheral spacer 25 fixed to the vibration board 21 moves in the vertical direction in the drawings. By this movement, the peripheral spacer 25 in the other pair module 4 that is adjacent to the pair module 4 is pressed, and the vibration board 21 to which this peripheral spacer 25 is fixed deforms. Therefore, the piezoelectric elements 22 and 23 that are fixed to the vibration board 21 deform. Thus, deformation of the pair module 4 can be transmitted to another pair module 4. A distance between the piezoelectric element 23 located on the outer side of one pair module 4 and another piezoelectric element 23 located on the outer side of another pair module 4 that is adjacent to the former pair module 4 is maintained constant through the peripheral spacer 25. Therefore, it is possible to prevent the two piezoelectric elements 23 from coming into contact with each other. The opposed central spacers 24, or the opposed peripheral spacers 25 can be adhered to each other so that a positional deviation is not generated.

(Configuration of Power Generation Unit—Module Supporting Body 3A)

As shown in FIG. 1, the module supporting body 3A supports the power generation modules 2A, and corresponds to the supporting unit in the appended claims. The module supporting body 3A includes a case body 31 and a pressurizing block 32 that functions as a lid for closing an opening of the case body 31. The case body 31 has a hollow portion therein, and the stacked power generation modules 2A are arranged in the hollow portion. In this state, the power generation modules 2A are sandwiched between the case body 31 and the pressurizing block 32 and stably supported. To further enhance the stability of the supported power generation modules 2A, the peripheral spacer 25 of the power generation module 2A located on the outermost side can be fixed on an inner surface of the case body 31 or the pressurizing block 32 by an adhesive. Although not illustrated in the drawings, pull-out holes through which the plus lead wire and the minus lead wire are pulled out from the case body 31 are formed in the case body 31. In the power generation unit 1A with the configuration described above, the power generation modules 2A are connected with each other through the central spacers 24 and the peripheral spacers 25. It is unnecessary to individually support the power generation modules 2A by the module supporting body 3A, the module supporting body 3A can be constituted simply and the weight of the body 3A can be reduced.

(Effect of First Embodiment)

According to the first embodiment, the piezoelectric elements 22 and 23 can be deformed in the pair module 4 around the central spacer 24 as a fulcrum, and the piezoelectric elements 22 and 23 can be deformed between the pair modules 4 around the peripheral spacers 25 as fulcrums. Therefore, in all of the stacked pair modules 4, the piezoelectric elements 22 and 23 can be deformed, the power generating efficiency can be enhanced, and a high power generation capacity can be obtained. Because the piezoelectric elements 22 and 23 are curved over the entire fixing surface with respect to the vibration board 21, a force can be applied to the entire piezoelectric elements 22 and 23, the power generating efficiency can be enhanced, and a high power generation capacity can be obtained.

Further, it is unnecessary that the module supporting body 3A individually holds the stacked power generation modules 2A, and it is only necessary that the power generation modules 2A can be guided such that the power generation modules 2A can reliably move in the stacked direction. Therefore, the structure of the module supporting body 3A can be simplified, the manufacturing procedure can be simplified, and thus the manufacturing cost can be reduced and the weight of the power generation unit 1A can be reduced.

Second Embodiment

A second embodiment is explained next. This embodiment is a mode in which the shape of a vibration board is devised to enhance the power generating efficiency and the like. The configuration of the second embodiment is substantially identical to the configuration of the first embodiment unless otherwise specified. Constituent elements of the second embodiment substantially identical to those of the first embodiment are denoted by like reference numerals and/or names used in the first embodiment as necessary, and explanations thereof will be omitted.

Figure 8:
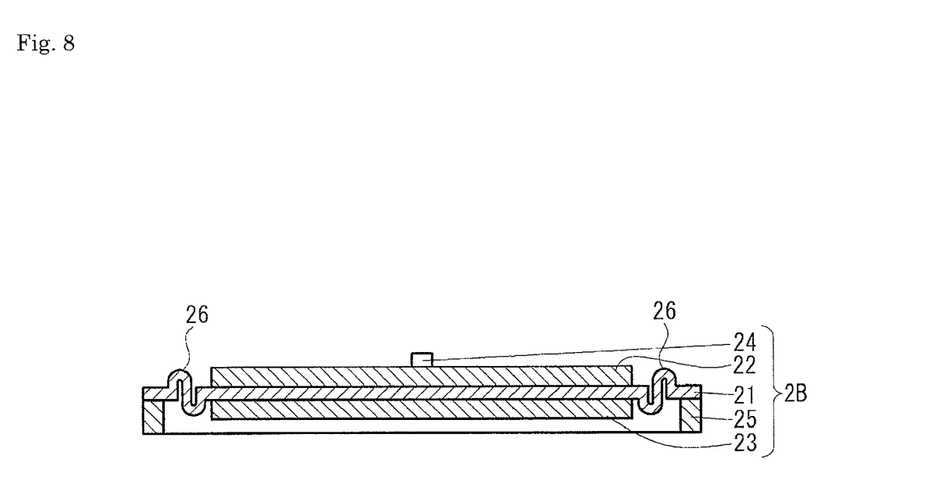
FIG. 8 A vertical sectional view of a power generation module according to a second embodiment.

FIG. 8 is a vertical sectional view of a power generation module according to the second embodiment. Bent portions 26 are provided on a side of the vibration board 21 of a power generation module 2B on a side of outer peripheries of the piezoelectric elements 22 and 23. The bent portions 26 are formed by pressing and bending the vibration board 21 by a pressing machine. The bent portion 26 is formed such that it is oriented in a direction nonparallel to a main surface direction of the vibration board 21 (a direction of a surface of the vibration board from which the bent portion is removed) (such that a substantially S-shaped cross section is obtained).

By providing the bent portions 26, the rigidity of the vibration board 21 is lowered. Therefore, when an external force is applied to the piezoelectric elements 22 and 23, when the external force is transmitted to the vibration board 21 through the piezoelectric elements 22 and 23, the vibration board 21 is relatively easily deformed, the piezoelectric elements 22 and 23 are allowed to deform, and thus the piezoelectric elements 22 and 23 easily deform, and the power generating efficiency is enhanced. While it suffices that the bent portion 26 is provided on at least a portion of the side of the vibration board 21, it is preferable to continuously form the bent portions 26 around the entire periphery of the side of the vibration board 21 with the same shapes because the rigidity of the vibration board 21 is uniformly lowered.

Figure 9:
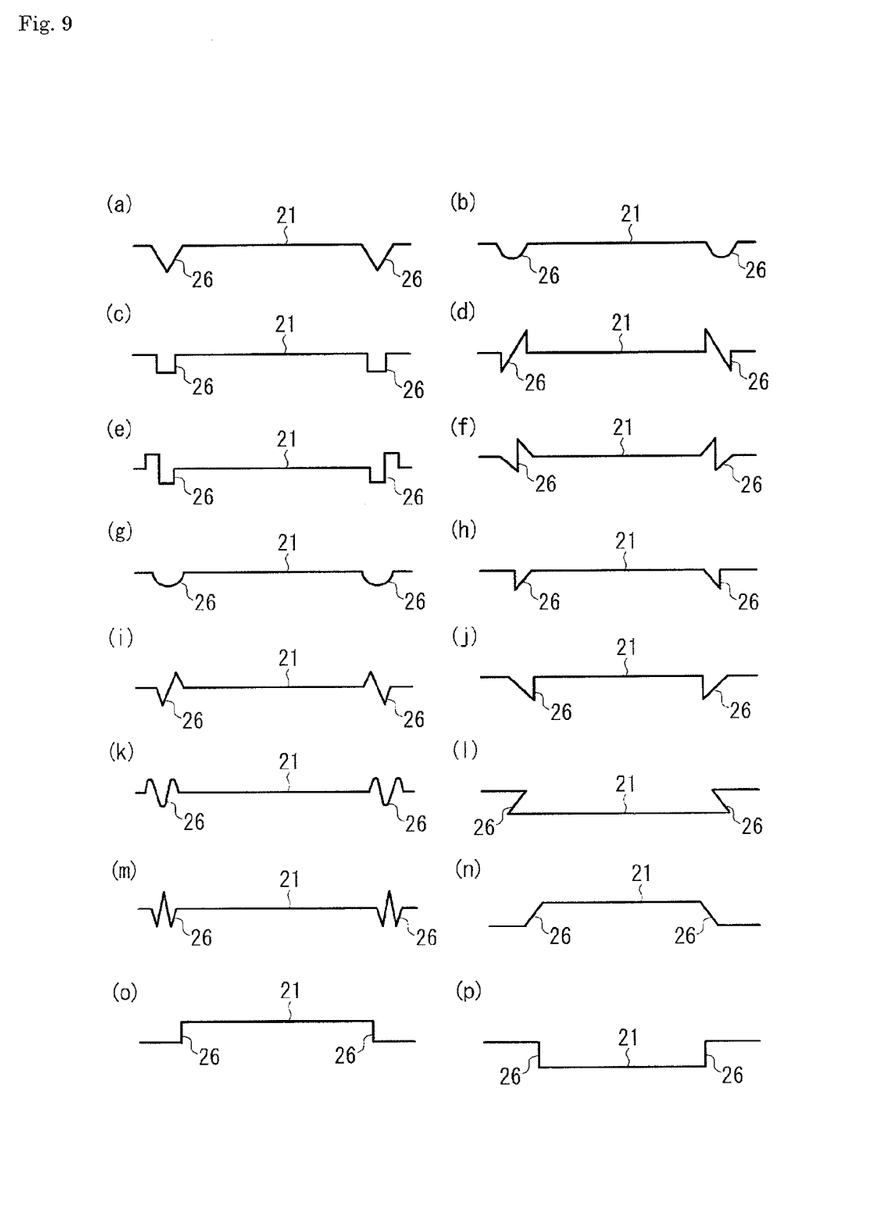

Various shapes of the bent portions 26 can be employed in addition to the shape shown in FIG. 8. FIGS. 9(*a*) to (*p*) show vertical cross section shapes of the vibration board 21 according to modifications in a simplified manner.

(Effect of Second Embodiment)

According to the second embodiment, the rigidity of the vibration board 21 is lowered by providing the bent portions 26, the vibration board 21 relatively easily deforms, and this allows the piezoelectric elements 22 and 23 to deform. Therefore, the piezoelectric elements 22 and 23 easily deform, and the power generating efficiency is enhanced.

Third Embodiment

A third embodiment is explained next. This embodiment is a specific usage mode of a power generation unit and a mode in which the power generation unit is incorporated in a bicycle pedal. The configuration of the third embodiment is substantially identical to the configuration of the first embodiment unless otherwise specified. Constituent elements of the third embodiment substantially identical to those of the first embodiment are denoted by like reference numerals and/or names used in the first embodiment as necessary, and explanations thereof will be omitted.

Figure 10:
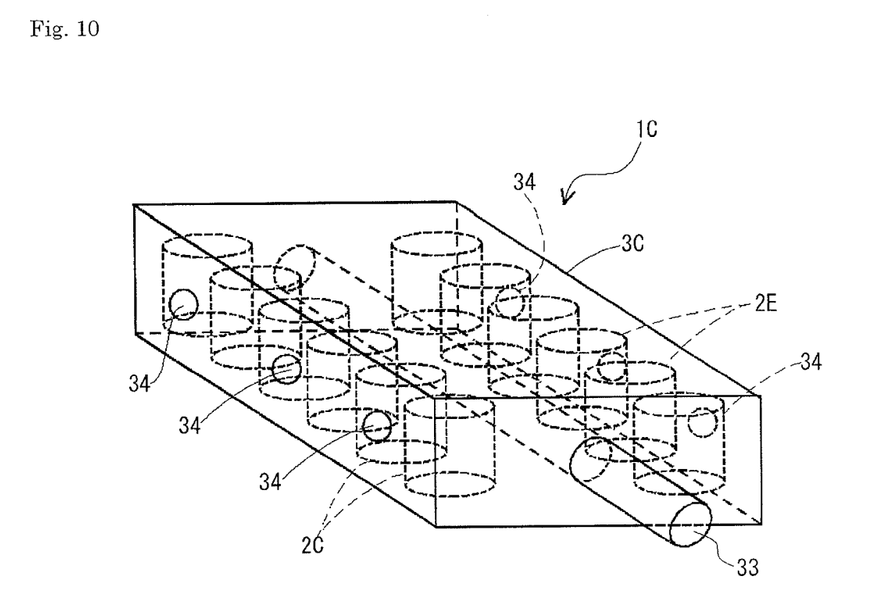
FIG. 10 A schematic perspective view of a power generation unit according to a third embodiment.

FIG. 10 is a schematic perspective view of a power generation unit according to the third embodiment. A power generation unit 1C is constituted by incorporating a plurality of power generation modules 2C (an outer shape of each of stacked power generation modules 2C is shown with a cylindrical shape in FIG. 10) formed in the same manner as the power generation modules 2A into a module supporting body 3C that is constituted as a bicycle pedal. The module supporting body 3C is constituted as an integral hollow box body instead of a divided structure having the case body and the pressurizing block shown in FIG. 1. The module supporting body 3C includes a pedal shaft 33. The module supporting body 3C is connected to the bicycle (not shown) through the pedal shaft 33. A rider of the bicycle can pedal the bicycle in a state where the rider steps on the module supporting body 3C with his sole.

The power generation module 2C is arranged at a position close to a stepping surface (a pressurizing plate, corresponding to an operating surface in the appended claims) of the module supporting body 3C. The power generation module 2C is pressurized by deformation of the stepping surface.

A plurality of LEDs (Light Emitting Diodes) 34 are mounted on a side surface of the pedal that is intersecting with the stepping surface of the module supporting body 3C substantially at right angles, and the LEDs 34 are electrically connected to the power generation unit 1C through a control circuit (not shown). When a rider of the bicycle steps on the module supporting body 3C and pedals the bicycle, the stepping surface of the module supporting body 3C is deformed, an external force is applied to the power generation unit 1C, and the LEDs 34 illuminate or blink as night lamps by the electromotive force of the power generation module 2C. A circuit can be constituted such that when an optical sensor (not shown) is provided on the module supporting body 3C and intensity of light detected by the optical sensor is equal to a predetermined value or higher, power generated by the power generation unit 1C is stored in a battery (not shown), and when the intensity of light is less than the predetermined value, the LEDs 34 illuminate.

(Effect of Third Embodiment)

According to the third embodiment, the power generation module 2C is provided in the module supporting body 3C that is constituted as the pedal. Therefore, whenever a force is applied to the stepping surface of the module supporting body 3C, the power generation module 2C is pressurized and electricity is generated, and the LEDs 34 can illuminate with the generated current.

Fourth Embodiment

A fourth embodiment is explained next. This embodiment is a specific usage mode of a power generation unit and a mode in which the power generation unit is applied to a power supply of a remote controller for a television or an air conditioner. The configuration of the fourth embodiment is substantially identical to the configuration of the first embodiment unless otherwise specified. Constituent elements of the fourth embodiment substantially identical to those of the first embodiment are denoted by like reference numerals and/or names used in the first embodiment as necessary, and explanations thereof will be omitted.

Figure 11:
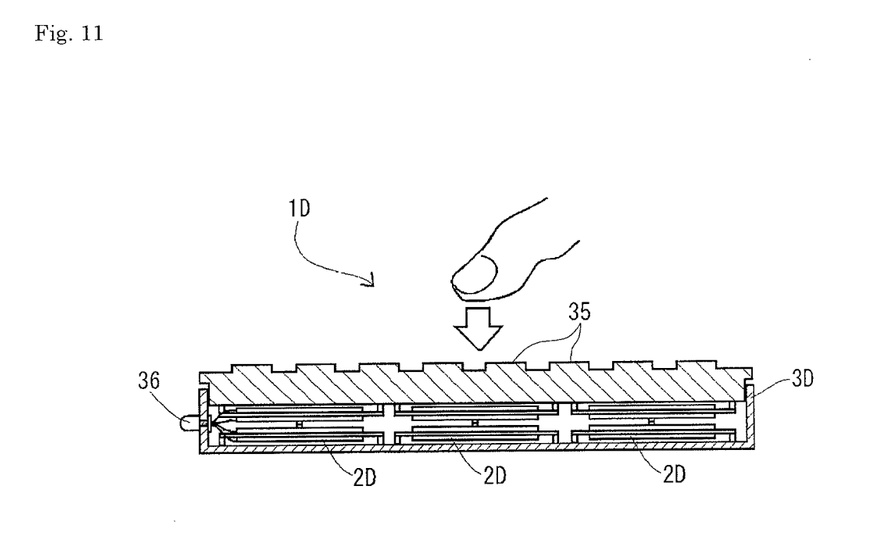
FIG. 11 A vertical schematic sectional view of a power generation unit according to a fourth embodiment.

FIG. 11 is a vertical sectional view of a power generation unit according to the fourth embodiment. A power generation unit 1D is constituted by incorporating a plurality of power generation modules 2D formed in the same manner as the power generation modules 2A into a module supporting body 3D constituted as a body of a remote controller (the sender in the appended claims). Push buttons 35 for the remote controller, a control circuit (not shown) and LEDs 36 for sending signals are provided on the module supporting body 3D in addition to the power generation module 2D, and the control circuit and the LEDs 36 are electrically connected to the power generation unit 1D.

Particularly, the push buttons 35 are provide on an upper surface (corresponding to the operating surface in the appended claims) of the module supporting body 3D, and when any of the push buttons 35 is pushed, the entire pressing plate is pushed down and deformed, and a force is applied to the power generation modules 2D provided at positions close to an upper surface of the pressing plate. With this arrangement, the power generation modules 2D generate electricity, the generated power is supplied to the control circuit, the LEDs 36 illuminate and control signal light can be outputted.

(Effect of Fourth Embodiment)

According to the fourth embodiment, the power generation modules 2D are provided in the module supporting body 3D constituted as the body of the remote controller. Therefore, by pushing the pressing plate on the upper surface of the module supporting body 3D, the power generation module 2D generates electricity and power that is necessary for operating the remote controller can be generated.

Fifth Embodiment

A fifth embodiment is explained next. This embodiment is a mode in which a power generation unit is incorporated in a shoe (here, a clog). The configuration of the fifth embodiment is substantially identical to the configuration of the first embodiment unless otherwise specified. Constituent elements of the fifth embodiment substantially identical to those of the fourth embodiment are denoted by like reference numerals and/or names used in the fourth embodiment as necessary, and explanations thereof will be omitted.

Figure 12:
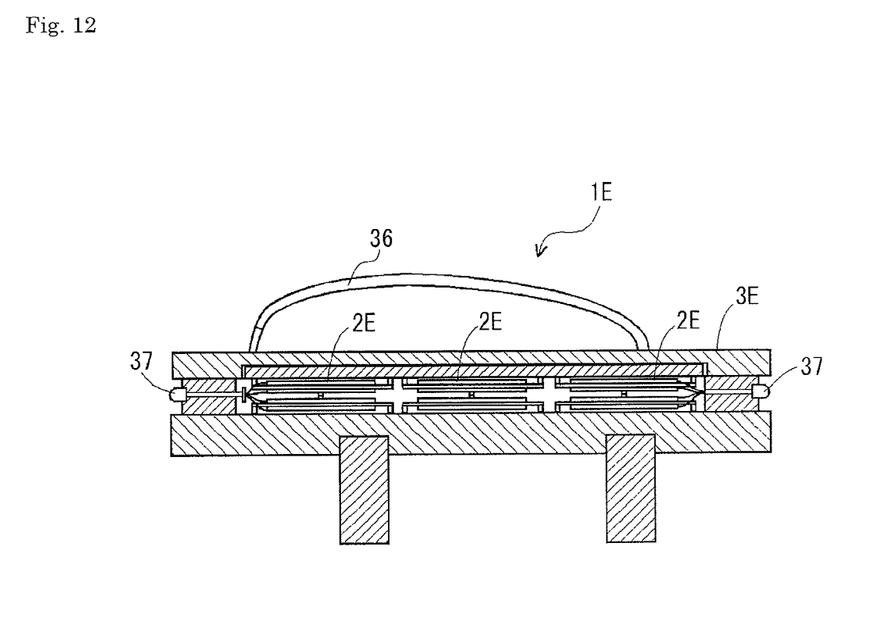
FIG. 12 A vertical sectional view of a power generation unit according to a fifth embodiment.

FIG. 12 is a vertical sectional view of the power generation unit of the fifth embodiment. A power generation unit 1E is constituted by incorporating a plurality of power generation modules 2E formed in the same manner as the power generation modules 2A into a module supporting body 3E constituted as a clog. An upper surface of the module supporting body 3E is formed as a smooth stepping surface (corresponding to the operating surface in the appended claims), and cords 36 are provided on the stepping surface. A user wears the clog through the cords 36 and can walk while stepping on the module supporting body 3E.

The power generation modules 2E are arranged at positions close to the stepping surface of the module supporting body 3E, and the power generation module 2E is pressurized by stepping on the stepping surface and deforming the same.

A plurality of LEDs 37 are provided on a side surface of the module supporting body 3E that intersects with the stepping surface of the module supporting body 3E substantially at right angles, and the plurality of LEDs 37 are electrically connected to the power generation module 2E through a control circuit (not shown). When a user steps on the module supporting body 3E and walks, the LEDs 37 illuminate or blink as night lamps by an electromotive force of the power generation module 2E.

(Effect of Fifth Embodiment)

According to the fifth embodiment, because the power generation modules 2E are provided in the module supporting body 3E constituted as the clog, whenever a force is applied to the stepping surface, the power generation module 2E is pressurized, electricity is generated, and the LEDs 37 can blink and emit light by the generated current. With this arrangement, when a user walks in the nighttime, the power generation module 2E is pressurized and electricity is generated by deformation of the stepping surface, and the LEDs 37 illuminate by the generated current. Therefore, the LEDs 37 illuminate forward and backward, safety around the footing of the user is secured, and the illumination commands attention of vehicle drivers.

Sixth Embodiment

A sixth embodiment is explained next. This embodiment is a mode in which piezoelectric elements are stacked using a different structure from that of the first embodiment. The configuration of the sixth embodiment is substantially identical to the configuration of the first embodiment unless otherwise specified. Constituent elements of the sixth embodiment substantially identical to those of the fourth embodiment are denoted by like reference numerals and/or names used in the fourth embodiment as necessary, and explanations thereof will be omitted.

Figure 13:
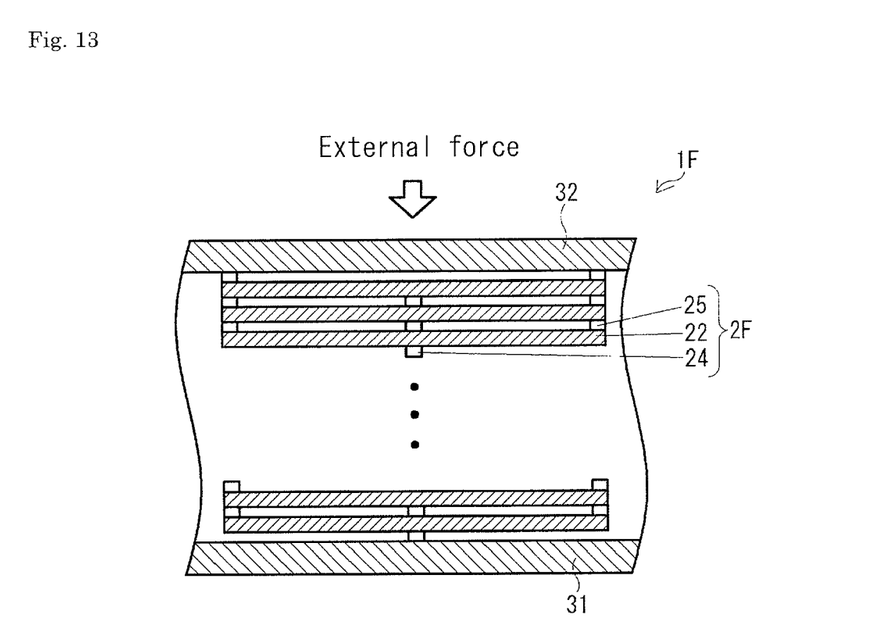
FIG. 13 A vertical sectional view of relevant parts of a power generation unit according to a sixth embodiment.
Figure 14:
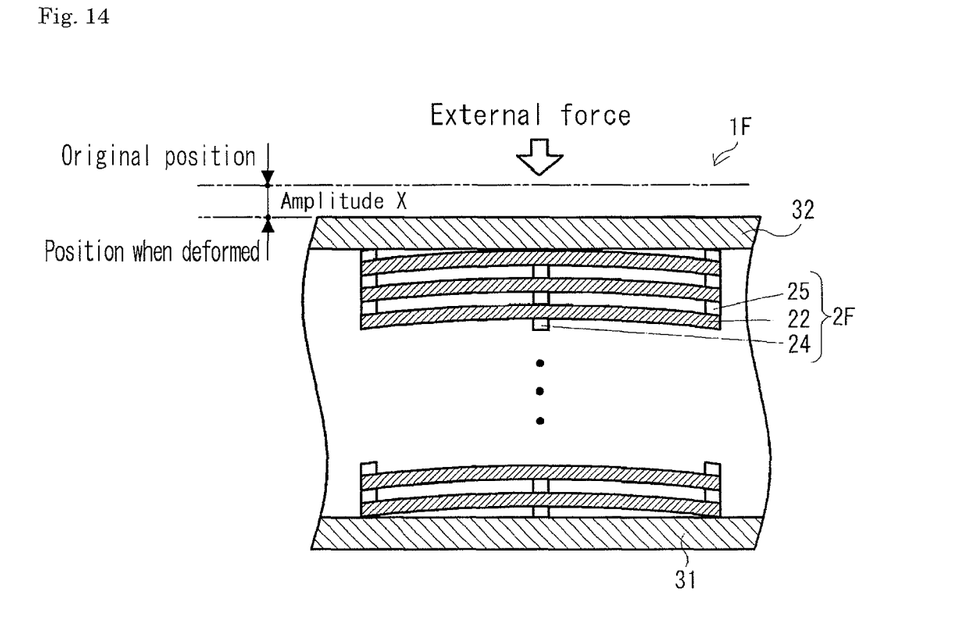
FIG. 14 A vertical sectional view of relevant parts of the power generation unit in FIG. 13 in a deformed state.

FIG. 13 is a vertical sectional view of relevant parts of a power generation unit according to the sixth embodiment and FIG. 14 is a vertical sectional view of relevant parts of the power generation unit in FIG. 13 in a deformed state. In FIGS. 13 and 14 (also in later-described FIGS. 15 and 17), an interior of the power generation unit is partially omitted. A power generation unit 1F is constituted by stacking a plurality of power generation modules 2F in the case body 31 and the pressurizing block 32. Each of the power generation modules 2F includes the piezoelectric elements 22, the central spacers 24 respectively arranged on one of surfaces of each of the piezoelectric elements 22, and the peripheral spacers 25 respectively arranged on the other surface of the piezoelectric element 22. In the sixth embodiment, the vibration board is omitted unlike the first embodiment, the central spacers 24 and the peripheral spacers 25 are directly fixed to the piezoelectric elements 22 by known fixing means including adhering.

In this structure, when the pressurizing block 32 is pressurized by an external force, an outer periphery of each of the piezoelectric elements 22 is pressed by the peripheral spacer 25, and a position of a center portion of the piezoelectric element 22 is fixed by the central spacer 24. Therefore, the outer periphery of the piezoelectric element 22 is deformed in the same direction around the center portion as shown in FIG. 14. Particularly, FIG. 14 shows a state where the pressurizing block 32 is pushed by an amplitude (hereinafter, "the amplitude X") corresponding to a thickness of one piezoelectric element 22. In this state, a deformation amount of each of the piezoelectric elements 22 is also equal to the amplitude X. In this structure, the vibration board is omitted as compared with the stacked structure in the first embodiment, and a distance between the piezoelectric elements 22 is suppressed to the thickness of one central spacer 24 or the peripheral spacer 25. Therefore, the stacking efficiency of the piezoelectric elements 22 can be further enhanced.

(Effect of Sixth Embodiment)

According to the sixth embodiment, as compared with the first embodiment, the stacking efficiency of the piezoelectric elements 22 can be further enhanced with a simpler stacked structure.

Seventh Embodiment

A seventh embodiment is explained next. This embodiment is a mode in which piezoelectric elements are stacked using a different structure from that of the first embodiment. The configuration of the seventh embodiment is substantially identical to the configuration of the first embodiment unless otherwise specified. Constituent elements of the seventh embodiment substantially identical to those of the fourth embodiment are denoted by like reference numerals and/or names used in the fourth embodiment as necessary, and explanations thereof will be omitted.

Figure 15:
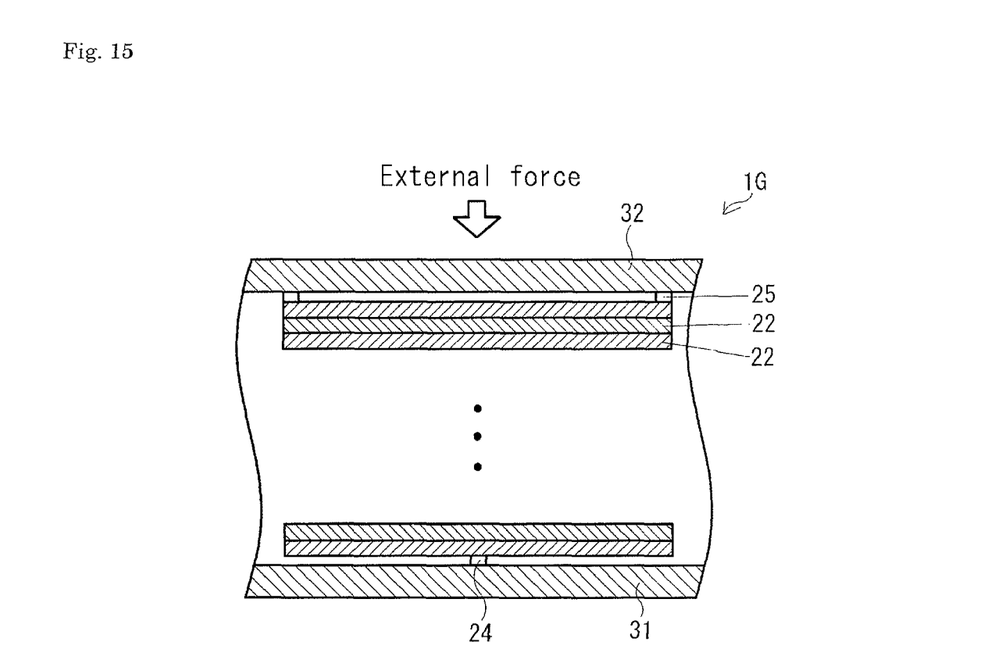
FIG. 15 A vertical sectional view of relevant parts of a power generation unit according to a seventh embodiment.
Figure 16:
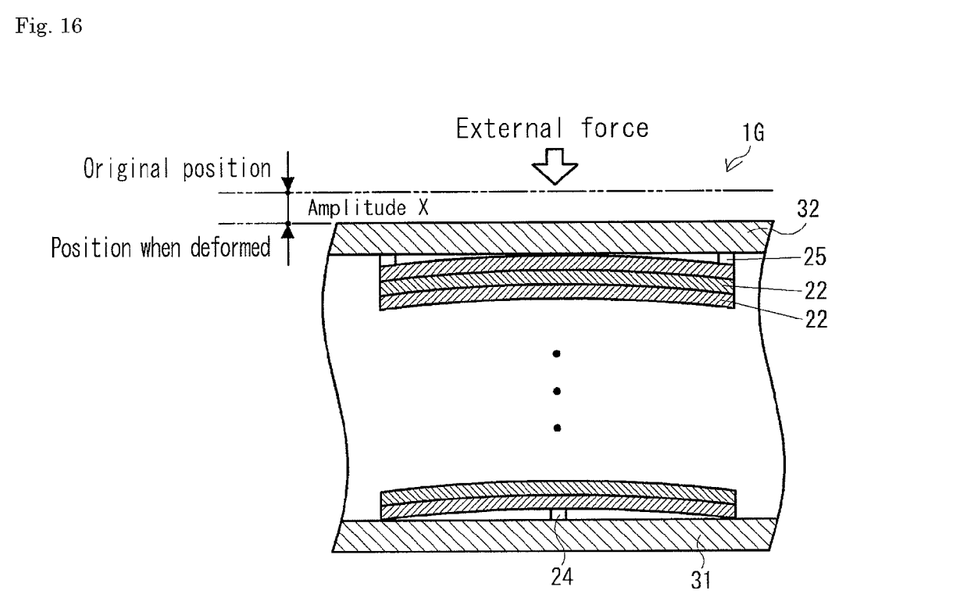
FIG. 16 A vertical sectional view of relevant parts of the power generation unit in FIG. 15 in a deformed state.

FIG. 15 is a vertical sectional view of relevant parts of a power generation unit according to the seventh embodiment and FIG. 16 is a vertical sectional view of relevant parts of the power generation unit in FIG. 15 in a deformed state. A power generation unit 1G includes a plurality of piezoelectric elements 22, the central spacer 24 arranged on an outer surface of the outermost one (the lowest one in FIGS. 15 and 16) of the piezoelectric elements 22, and the peripheral spacer 25 arranged on an outer surface of the other outermost one (uppermost one in FIGS. 15 and 16) of the piezoelectric elements 22, and these piezoelectric elements 22, the central spacer 24 and the peripheral spacer 25 are arranged in the case body 31 and the pressurizing block 32. The stacked state of the piezoelectric elements 22 is maintained by a friction force caused by close contact between the piezoelectric elements 22, or portions of at least opposed surfaces of the piezoelectric elements 22 are adhered to each other by an adhesive, and the stacked state is maintained. Unlike the first embodiment, the vibration board is omitted, and the central spacer 24 and the peripheral spacer 25 are fixed directly to the piezoelectric elements 22 by known fixing means including adhering.

In this structure, when the pressurizing block 32 is pressed by an external force, outer peripheries of the piezoelectric elements 22 are pressurized through the peripheral spacer 25, and positions of a central portion of the piezoelectric elements 22 are fixed by the central spacer 24. Therefore, the outer peripheries of the piezoelectric elements 22 are deformed in the same direction around the central portion as shown in FIG. 16. Particularly, FIG. 16 shows a state where the pressurizing block 32 is pushed by an amplitude (hereinafter, "the amplitude X") corresponding to a thickness of one piezoelectric element 22. In this state, a deformation amount of each of the piezoelectric elements 22 is also equal to the amplitude X. In this structure, the vibration board is omitted as compared with the stacked structure in the first embodiment, and a distance between the piezoelectric elements 22 is substantially eliminated. Therefore, the stacking efficiency of the piezoelectric elements 22 can be further enhanced.

(Effect of Seventh Embodiment)

According to the seventh embodiment, as compared with the first embodiment, the stacking efficiency of the piezoelectric elements 22 can be further enhanced with a simpler stacked structure.

Eighth Embodiment

An eighth embodiment is explained next. This embodiment is a mode in which piezoelectric elements are stacked using a different structure from that of the first embodiment. The configuration of the eighth embodiment is substantially identical to the configuration of the first embodiment unless otherwise specified. Constituent elements of the eighth embodiment substantially identical to those of the fourth embodiment are denoted by like reference numerals and/or names used in the fourth embodiment as necessary, and explanations thereof will be omitted.

Figure 17:
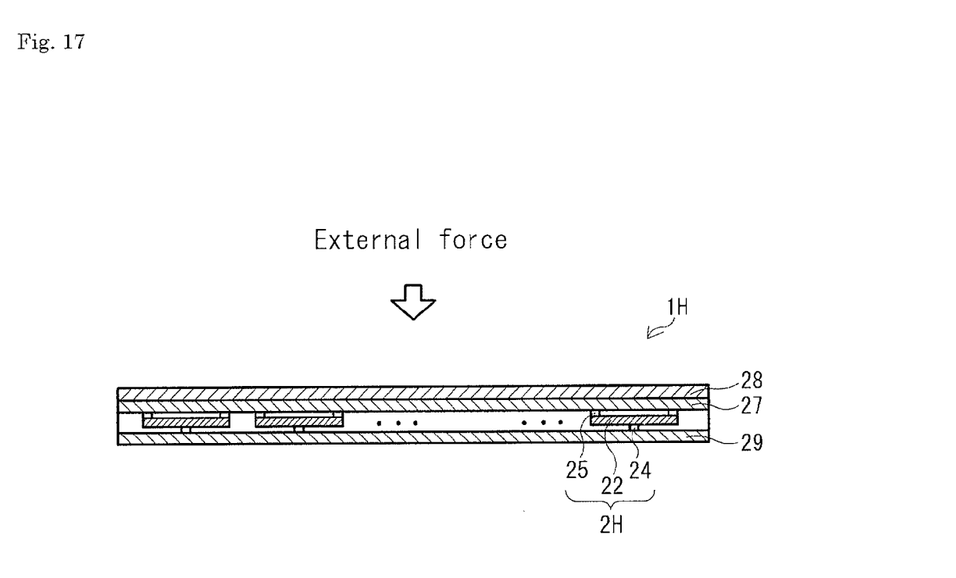
FIG. 17 A vertical sectional view of relevant parts of a power generation unit according to an eighth embodiment.
Figure 18:
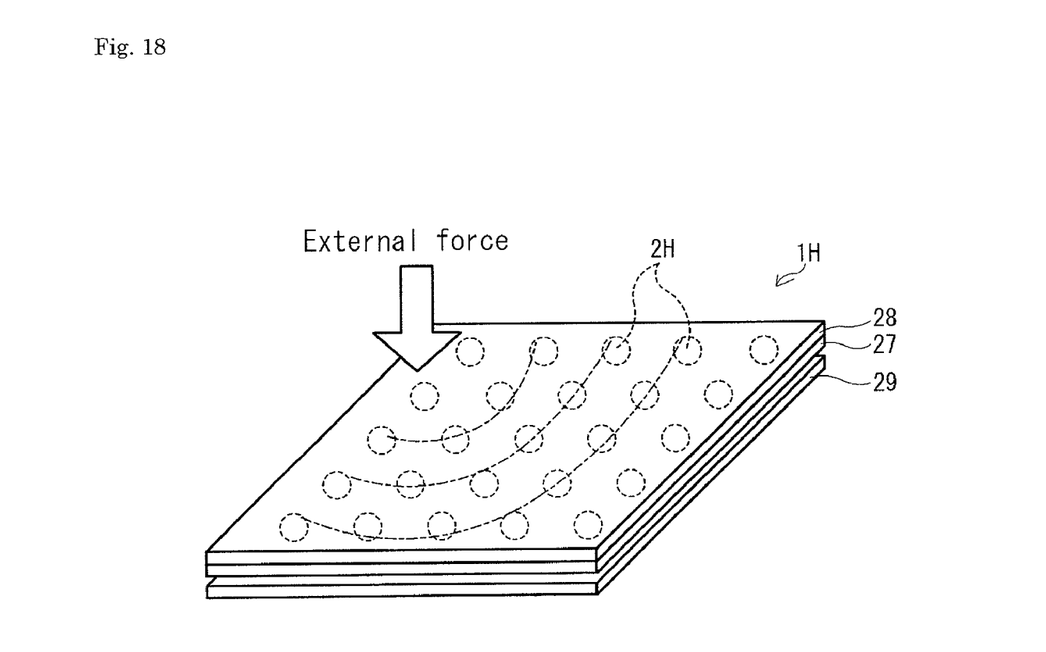
FIG. 18 A perspective view of relevant parts of the power generation unit.

FIG. 17 is a vertical sectional view of relevant parts of a power generation unit according to the eighth embodiment and FIG. 18 is a perspective view of relevant parts of the power generation unit. A power generation unit 1H is constituted by arranging a plurality of power generation modules 2H on one of surfaces (the lower surface in FIGS. 17 and 18) of a wide flexible vibration board 27 along the vibration board 27. Each power generation module 2H includes one piezoelectric element 22, the central spacer 24 arranged on one of surfaces (the lower surface in FIGS. 17 and 18) of the piezoelectric element 22, and the peripheral spacer 25 arranged on the other surface (the upper surface in FIGS. 17 and 18) of the piezoelectric element 22. The power generation modules 2A, 2B, 2C, 2D, 2E, and 2F can be arranged instead of the power generation modules 2H.

A pair of floorboards 28 and 29 are laid such that the power generation unit 1H is sandwiched therebetween. The floorboard 28 is in direct contact with the vibration board 27, and the central spacer 24 abuts against the floorboard 29. The floorboard 29 can be the vibration board 27.

In this structure, when people walk on the floorboard 28 and the floorboard 28 vibrates, this vibration is transmitted to the vibration board 27. Because the vibration board 27 is flexible, when a portion of the vibration board 27 vibrates, this vibration is propagated through the vibration board 27 as schematically shown with chain lines in FIG. 18. Therefore, it is possible to transmit the vibration not only to the piezoelectric element 22 located near the vibration source but also to another piezoelectric element 22 located far from the vibration source, and the piezoelectric element 22 can be deformed.

(Effect of Eighth Embodiment)

According to the embodiment, vibration can be transmitted over a wide range separated from a vibration source, and the power generating efficiency can be further enhanced.

[III] Modifications of Respective Embodiments

While respective embodiments of the present invention have been explained above, specific configurations and means of the present invention can be arbitrarily modified or improved within the technical scope of the respective inventions described in the claims. Such modifications are explained below.

(Regarding Problem to be Solved by the Invention and Effect of the Invention)

The problem to be solved by the invention and the effect of the invention are not limited to those described above, and the present invention can also solve problems not mentioned above or achieve effects not mentioned above. Further, in the present invention, only a part of the problem described above may be solved and only a part of the effect described above may be achieved.

(Regarding Specific Application of Power Generation Modules 2A to 2H)

Each of the above embodiments includes a plurality of sets respectively having the plurality of stacked power generation modules 2A to 2H; however, the present invention also includes any mode using one or plural stacked power generation modules 2A to 2H according to its purpose of use. For example, the present invention includes any of modes in which the stacked power generation modules 2A to 2H are formed in one line or plural lines, and they are laid in regular lines or diagonal lines.

(Regarding Specific Arrangement of Power Generation Modules 2A to 2H)

Although the sets of the stacked power generation modules 2A to 2H are arranged on the flat surface in the first embodiment, they can be also arranged on a curved surface. For example, these modules can be arranged on a circumferential surface of a cylindrical body. In this case, by applying an external force to the circumferential surface of the cylindrical body on which the power generation modules 2A to 2H are arranged by a predetermined method (for example, a method of pressing a projection provided on a circumferential surface of a cylindrical body), the power generation modules 2A to 2H can be pressurized and electricity can be generated.

According to one aspect of the above mentioned embodiments, the piezoelectric element can be deformed through the spacer. Therefore, when a pressurizing force is applied in the stacking direction of the power generation modules, the pressurizing force is not dispersed to the module supporting bodies, the pressurizing force is transmitted to all of the vibration boards in series through the central spacer, and the pressurizing force can be effectively applied to a curve of each of the vibration boards.

According to another aspect of the above mentioned embodiments, the piezoelectric element can be deformed around the central spacer as a fulcrum. Therefore, when a pressurizing force is applied in the stacking direction of the power generation modules, the pressurizing force is not dispersed to the module supporting bodies, the pressurizing force is transmitted to all of the vibration boards in series through the central spacer, and the pressurizing force can be effectively applied to a curve of each of the vibration boards. A force is applied to a center of the piezoelectric element from the central spacer and a stress caused by the curve of the vibration board is applied to the entire fixing surface with respect to the vibration board. Therefore, a high power generation capacity can be obtained. It is unnecessary that the module supporting body holds the plurality of stacked power generation modules, and it is only necessary that the module supporting body can guide the power generation module so that the power generation module can reliably move in the stacking direction. Therefore, the structure of the module supporting body can be simplified, its manufacturing cost can be reduced, and the weight thereof can be reduced.

According to another aspect of the above mentioned embodiments, the piezoelectric element can be deformed around the peripheral spacer as a fulcrum between the power generation modules. Therefore, when a pressurizing force is applied in the stacking direction of the power generation modules, the pressurizing force is not dispersed to the module supporting bodies, the pressurizing force is transmitted to all of the vibration boards in series through the central spacer, and the pressurizing force can be effectively applied to a curve of each of the vibration boards.

According to another aspect of the above mentioned embodiments, the vibration board can be omitted, and a distance between the piezoelectric elements can be suppressed to a thickness of one spacer. Therefore, the stacking efficiency of the piezoelectric elements can be further enhanced with a simpler stacking structure.

According to another aspect of the above mentioned embodiments, the vibration board can be omitted, and a distance between the piezoelectric elements can be substantially eliminated. Therefore, the stacking efficiency of the piezoelectric elements can be further enhanced with a simpler stacking structure.

According to another aspect of the above mentioned embodiments, the peripheral spacer is formed into an annular body. Therefore, when an external force is applied to the power generation module along the stacking direction, the entire vibration board can be equally curved around the peripheral spacer as a fulcrum. With this arrangement, it is possible to effectively apply a force to the entire piezoelectric element that is fixed to the vibration board, and thus a high power generation capacity can be obtained.

According to another aspect of the above mentioned embodiments, the peripheral spacer is formed into the columnar body. Therefore, when an external force is applied to the power generation module along the stacking direction, the entire vibration board can be equally curved around the peripheral spacer as a fulcrum. With this arrangement, it is possible to effectively apply a force to the entire piezoelectric element that is fixed to the vibration board, and thus a high power generation capacity can be obtained.

According to another aspect of the above mentioned embodiments, vibration can be transmitted to a wide range separated from a vibration source, and thus the power generating efficiency can be further enhanced.

According to another aspect of the above mentioned embodiments, the vibration board is provided with the bent portion. Therefore, the vibration board can be relatively easily deformed by lowering the rigidity of the vibration board, this allows the piezoelectric element to deform, the piezoelectric element can easily deform, and the power generating efficiency is enhanced.

According to another aspect of the above mentioned embodiments, electricity can be generated by the power generation module by pressing a bicycle pedal, a sender, or an operating surface of a shoe in a normal usage mode.

INDUSTRIAL APPLICABILITY

The power generation unit according to the present invention can be applied to a power generation unit that can convert an externally applied force into electricity and take out the electricity. Particularly, according to the power generation unit of the present invention, a pressurizing force can be transmitted to each of vibration boards without dispersing the force, the pressurizing force is effectively applied to a curve of each of the vibration boards, and thus a high power generation capacity can be obtained. The present invention is useful as a power generation unit in which a structure of a module supporting body is simplified, thereby reducing the manufacturing cost of the power generation unit, and the weight of the module supporting body is reduced.

The invention claimed is:

1. A power generation unit that converts an externally applied force into electricity, comprising:
a plurality of power generation modules; and
supporting units that support the power generation modules, wherein
the power generation module includes a flexible vibration board, piezoelectric elements fixed on both surfaces of the vibration board, and spacers,
the spacers are arranged between the piezoelectric elements, which are arranged in a stacked manner, or arranged between a piezoelectric element and a pressing surface that presses the piezoelectric element,
the spacers form a deformation space of the piezoelectric element and transmit a deformation force to the piezoelectric element,
the spacers includes central spacers that are fixed to the piezoelectric elements fixed on one of surfaces of the vibration board and arranged near a central portion of the piezoelectric element, and
the power generation modules are stacked such that the central spacer of the power generation module and the central spacer of at least one of the power generation modules that is adjacent to the former power generation module are in contact with each other on a same axis.

2. The power generation unit according to claim 1, wherein
the power generation module includes peripheral spacers, as the spacers, that are fixed on a side of outer peripheries of the piezoelectric elements on the other surface of the vibration board or the vibration board and that project outward of the piezoelectric element, and
the power generation modules are stacked such that the peripheral spacer of the power generation module and the peripheral spacer of at least one of the power generation modules that is adjacent to the former power generation module are in contact with each other.

3. The power generation unit according to claim 2, wherein the peripheral spacer is an annular body formed along a circumferential direction of the piezoelectric element.

4. The power generation unit according to claim 2, wherein the peripheral spacer is a columnar body arranged at a plurality of positions along a circumferential direction of the piezoelectric element.

5. The power generation unit according to claim 1, wherein a bent portion that is nonparallel to a main surface direction of the vibration board is provided on a side of an outer periphery of the piezoelectric element in the vibration board.

6. The power generation unit according to claim 1, wherein the power generation module can be pressed through a bicycle pedal, a sender, or an operating surface of a shoe.

7. A power generation unit that converts an externally applied force into electricity, comprising:
  a plurality of power generation modules, and
  supporting units that support the power generation modules, wherein
  the power generation module includes a flexible vibration board, a piezoelectric elements fixed on both surfaces of the vibration board, central spacers, and peripheral spacers,
  the central spacers are fixed on one surface of the piezoelectric elements and arranged near a central portion of the piezoelectric elements,
  the peripheral spacers are fixed on the other surface of the piezoelectric elements and arranged near an outer peripheral portion of the piezoelectric elements,
  the plurality of power generation modules are stacked such that the central spacer of one of the power generation modules is in contact with the central spacer of the other power generation module that is adjacent to the power generation module, and
  the central spacers and the peripheral spacers form a deformation space of the piezoelectric elements and transmit a deformation force to the piezoelectric elements.

* * * * *